United States Patent
Hotta et al.

[11] Patent Number: 5,834,850
[45] Date of Patent: Nov. 10, 1998

[54] ENCAPSULATED SEMICONDUCTOR DEVICE HAVING METAL FOIL COVERING, AND METAL FOIL

[75] Inventors: Yuji Hotta; Hitomi Shigyo; Shinichi Ohizumi; Seiji Kondoh, all of Osaka, Japan

[73] Assignee: Nitto Denko Corporation, Osaka, Japan

[21] Appl. No.: 702,792

[22] Filed: Aug. 26, 1996

Related U.S. Application Data

[63] Continuation of Ser. No. 501,142, Jul. 11, 1995, abandoned.

[30] Foreign Application Priority Data

Jul. 12, 1994 [JP] Japan .................................. 6-159796
Feb. 22, 1995 [JP] Japan .................................. 7-033677

[51] Int. Cl.⁶ .................................................. H01L 23/29
[52] U.S. Cl. ..................... 257/788; 257/687; 257/783; 257/787; 257/789; 257/795; 257/796
[58] Field of Search .................................. 257/659, 660, 257/706, 712, 713, 729, 796, 789, 797, 795, 687, 783, 787, 788, 790

[56] References Cited

U.S. PATENT DOCUMENTS

| | | | |
|---|---|---|---|
| 4,177,480 | 12/1979 | Hintzmann et al. | 357/84 |
| 4,953,002 | 8/1990 | Nelson et al. | 257/659 |
| 5,317,195 | 5/1994 | Ishikawa et al. | 257/787 |
| 5,406,117 | 4/1995 | Dlugokecki et al. | 257/660 |

FOREIGN PATENT DOCUMENTS

| | | | |
|---|---|---|---|
| 0144984 | 6/1983 | Japan | 257/795 |
| 0158648 | 8/1985 | Japan | 257/797 |
| 0250846 | 10/1988 | Japan | H01L 23/28 |
| 0021655 | 1/1993 | Japan | 257/660 |

*Primary Examiner*—Sara W. Crane
*Assistant Examiner*—Douglas A. Willie
*Attorney, Agent, or Firm*—Sughrue, Mion, Zinn, Macpeak & Seas, PLLC

[57] ABSTRACT

A metal foil material for covering a semiconductor device, a semiconductor device covered with the metal foil material, and a process for producing the metal foil-covered semiconductor device are disclosed. The metal foil material is one which is, in molding a resin for encapsulating a semiconductor element using a mold, temporarily fixed on a surface of a cavity of the mold, and is adhered on a surface of a semiconductor device by injecting the encapsulating resin into the mold and molding the resin, wherein a contact angle of the face of the metal foil material which is in contact with the encapsulating resin during molding, to water is 110° or less.

13 Claims, 2 Drawing Sheets

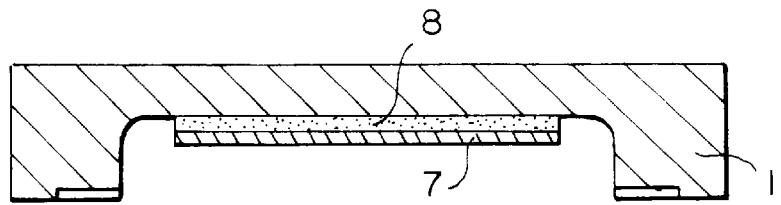
FIG.1(A)
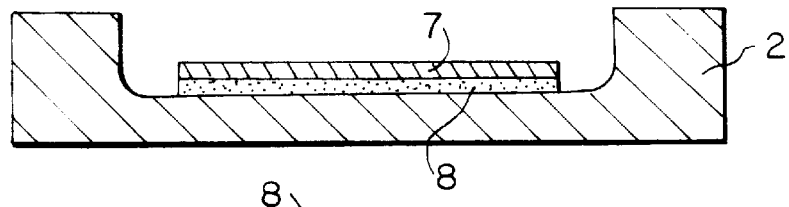
FIG.1(B)
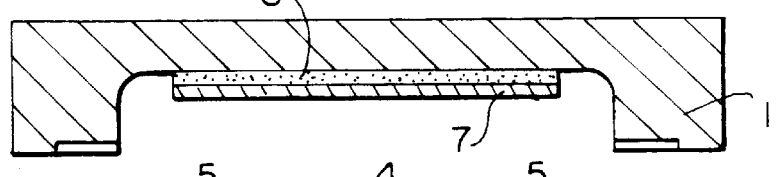
FIG.1(C)
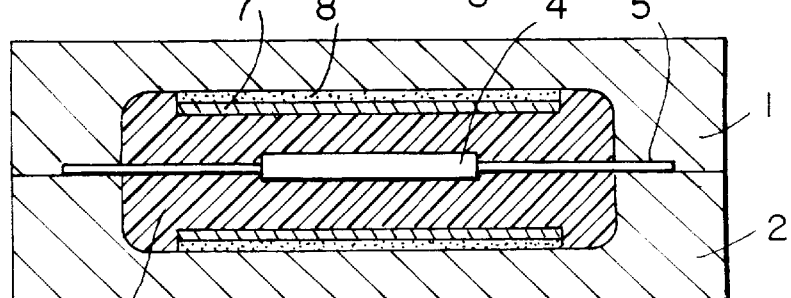
FIG.1(D)
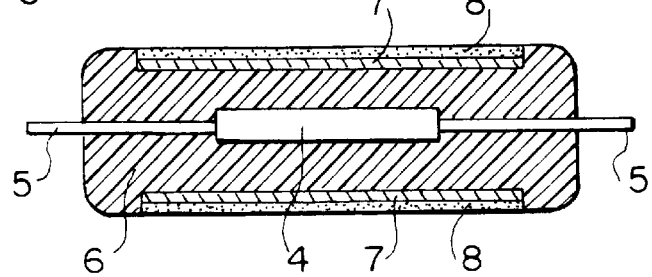

ENCAPSULATED SEMICONDUCTOR DEVICE HAVING METAL FOIL COVERING, AND METAL FOIL

This is a continuation of application Ser. No. 08/501,142 filed Jul. 11, 1995 now abandoned.

FIELD OF THE INVENTION

This invention relates to a metal foil material which is adhered on the surface of a semiconductor device having a semiconductor element encapsulated with a resin, a semiconductor device covered with the same, and a process for producing the semiconductor device.

BACKGROUND OF THE INVENTION

Semiconductor devices such as a transistor, an IC and an LSI are conventionally produced by encapsulating a semiconductor element with a ceramic, but in light of cost and productivity, they are popularly produced by encapsulating with resin. In this resin encapsulation, an epoxy resin has conventionally been used and good results have been obtained.

With the increase in a degree of integration through technical innovation in the semiconductor field, the size of the semiconductor is enlarged, but there is strongly demanded to miniaturize a semiconductor device and to be made it into a thin device. For this reason, the volume capacity which occupies a resin material for encapsulation decreases, and it is required for the encapsulating material to have higher reliability.

Particularly, in recent years, with the large-sizing of the semiconductor element, further improvement on performance for a thermal cycle test (TCT) which is an acceleration test for evaluating a resin for encapsulating a semiconductor material is required. As a process for mounting a semiconductor device on a printed board, a surface mounting has been popularized. For this reason, the encapsulating resin is required to possess a characteristic that when a semiconductor device is soldered in a moisture-absorbed state, no crack or swelling takes place in the semiconductor device.

For these requirements, in order to enhance resistance to thermal stress evaluated in the TCT test, it has conventionally been considered that fine rubber particles are added to an encapsulating resin or an epoxy resin is modified with a silicone compound, to decrease thermal stress.

For the purpose of enhancing the crack resistance when soldering, it has also been considered that an encapsulating resin having a small moisture-absorption is selected and that adhesion to a leadframe is improved, but their effects are yet insufficient.

The present inventors have proposed in U.S. patent application Ser. No. 08/421,253 filed on Apr. 13, 1995 that the surface of plastic package is covered with a metal foil in order to obtain a highly reliable semiconductor device excellent in moisture resistance, resistance to thermal stress, and crack resistance when soldering even when a semiconductor device is made into a thin type. As the process for producing it, the present inventors have proposed that when a resin for encapsulating a semiconductor element is molded, a metal foil material is temporarily fixed on the molding face of a mold, and a resin is then injected, followed by molding to directly fix the metal foil material on the surface of the plastic package. In this case, as a process for the temporary fixation on the molding face of the mold, a process in which an adhesive layer is provided on the face of a metal foil material to be temporarily fixed is proposed. JP-A-63-250846 (the term "JP-A" used herein means a Japanese unexamined patent publication) proposes a process for temporary fixation by physical means, such as vacuum adsorption, magnetic power, and gravity.

The process for producing a semiconductor device comprising temporarily fixing a metal foil material having an adhesive layer for temporary fixation on a mold via the adhesive layer, and injecting an encapsulating resin followed by molding the encapsulating resin has the following disadvantages:

(1) Since the adhesion between the metal foil material and the semiconductor device is insufficient, the metal foil material sometimes peels during molding the encapsulating resin, curing the encapsulating resin after molding, and applying thermal stress such as mounting the semiconductor device on a printed board, and as a result, the effects expected to be obtained by covering the surface of the semiconductor device with the metal foil, e.g., improvement in reliability after the TCT and improvement in crack resistance when soldering and the TCT, are partly impaired.

(2) Unless the tensile characteristics of the metal foil material used are appropriately selected, no effect of reliability nor crack resistance in the TCT can be exhibited.

(3) As for the metal foil material used to temporarily fix on the surface of mold cavity, depending on the type of the adhesive layer formed on the metal foil material, position deviation or mold stain sometimes occurs.

SUMMARY OF THE INVENTION

The present invention is accomplished in light of the above described problems involved in the prior art.

Accordingly, one object of the present invention is to provide a metal foil material for covering a semiconductor device, which imparts moisture resistance, resistance to thermal stress, and crack resistance when soldering.

Another object of the present invention is to provide a semiconductor device covered with the metal foil material.

Further object of the present invention is to provide a process for producing the semiconductor device covered with the metal foil material.

The metal foil material for covering a semiconductor device according to the present invention is one which is, in molding a resin for encapsulating a semiconductor element using a mold, temporarily fixed on a surface of a cavity of the mold, and is adhered on a surface of a semiconductor device by injecting the encapsulating resin into the mold and molding the resin, wherein a contact angle of the face of the metal foil material which is in contact with the encapsulating resin during molding, to water is 110° or less.

The semiconductor device obtained in the present invention is a semiconductor device covered with the above-described metal foil material.

The process for producing the semiconductor device covered with the metal foil comprises, in encapsulating a semiconductor device with a resin using a mold, temporarily fixing the above-described metal foil material on a face of a mold cavity having a surface roughness determined by 10 point average roughness, $R_1$, according to JIS B 0601-1982 of from 4 to 15 μm, and injecting an encapsulating resin followed by molding to adhere the metal foil material on the surface of the semiconductor device.

BRIEF DESCRIPTION OF THE DRAWINGS

FIGS. 1 (A) to (D) show one embodiment of a process for molding a semiconductor device of the present invention;

DETAILED DESCRIPTION OF THE INVENTION

Figure 2:
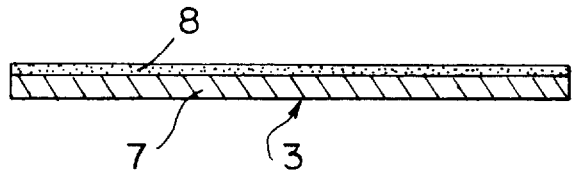
FIG. 2 is a schematic enlarged view showing one embodiment of the structure of the metal foil composite material.

The present invention will now be described in more detail by referring to the attached drawings which explain one embodiment of process for molding.

As shown in FIG. 1 (A) metal foil materials 7 are temporarily fixed on the cavity faces of open molds 1 and 2 via adhesive layers 8. Subsequently, as shown in FIG. 1 (B), semiconductor element 4 to be encapsulated, having leadframe 5 is provided. As shown in FIG. 1 (C), after molds 1 and 2 are closed, encapsulating resin 6 is injected into the mold, molded and cured therein. After curing, molds 1 and 2 are opened to take out a semiconductor device having metal foil material 7 adhered on the surface of the resin 6 as shown in FIG. 1 (D).

The term "temporary fixation" used herein means a degree of fixation such that the metal foil material does not separate by the opening and closing movement of molds but can easily peel off the mold after molding the resin.

FIG. 2 is a schematic enlarged view showing an embodiment of the structure of metal foil composite material 3. In metal foil composite material 3 exemplified here, adhesive layer 8 for temporary fixation on the cavity face of the mold is provided on one face of the metal foil material 7. This is provided for the purpose of preventing the change in the set position of the metal foil composite material 3 during the injection of the resin 6 into cavity portion of molds 1 and 2 and preventing the resin 6 from being impregnated between the metal foil composite material 3 and the mold cavity face.

In this case, when the metal foil material is temporarily fixed on the mold cavity face, and a semiconductor element is molded, and encapsulated with a resin to produce a metal foil-covered semiconductor device, the present invention is characterized in that a mold having a surface roughness (10 point average roughness: $R_z$; JIS B 0601-1982) of the mold cavity ranging from 4 to 15 $\mu$m is used to inject and mold an encapsulating resin.

To be specific, in combination with various resources of the adhesive layer formed on the metal foil material, a semiconductor device can be produced with good productivity and, at the same time, the resulting semiconductor device has a good appearance. If the surface roughness of the mold cavity portion is less than 4 $\mu$m, the releasing property on the metal foil-uncovered portion becomes poor. On the other hand, if it exceeds 15 $\mu$m, the fixation is insufficient during the temporary fixation of the metal foil.

The metal foil material used in the present invention will now be described below.

In the process that the present inventors previously proposed, peeling sometimes occurs between an encapsulating material and a metal foil material when molding, curing after molding, or applying thermal stress such as mounting the semiconductor device on a printed board. As a result of investigations to prevent the peeling when applying thermal stress, it has been found that increase in an affinity between the metal foil material and the encapsulating material is effective for preventing peeling. That is, construction where a contact angle of the face of the metal foil material which is in contact with the encapsulating resin when molding, to water is 110° or less, and preferably 25° to 100°, is effective. If the contact angle exceeds 110°, due to lack in the wettability with the encapsulating resin, an air-pocket arises in the interface between the metal foil material and the encapsulating resin and, as a result, there is a danger that the metal foil material peels off when molding the encapsulating resin, curing the encapsulating resin after molding, or applying thermal stress such as mounting the semiconductor device.

Although it is not shown in the drawings, a primer coat (e.g., silane coupling agent layer, or an adhesive material such as a polyimide resin, a polyether imide resin, an epoxy resin or a carbodiimide resin, which is usually used in the range of 0.1 to 20 $\mu$m thickness) for enhancing adhesion to the encapsulating resin material may be provided on the back surface of metal foil material.

The contact angle of the encapsulating resin to water is from 60° to 100°. This clearly shows that the contact angle is affected by the affinity between water and a material to be contacted.

In order to prevent the impairment of the metal foil-covered semiconductor device produced by the above process when applying thermal stress, the metal foil material has a tensile strength at room temperature in the range of from 5 to 20 kgf/mm², and an elongation at room temperature of 20% or more (i.e., even when the both ends of the metal foil material are stretched to elongate 20% or more, the metal foil material does not break), because even when the semiconductor device is deformed when applying various types of thermal stress, the metal foil material flexibly corresponds to the deformation so that it cannot peel off from the surface of the semiconductor device, and because it is especially effective for crack prevention.

If the elongation is more than 20% even when the tensile strength is from 5 to 20 kgf/mm², or conversely if the tensile strength deviates from the range of from 5 to 20 kgf/mm² even when the elongation is 20% or more, peeling undesirably occurs at an interface between the encapsulating resin and the metal foil material when applying thermal stress to the semiconductor device. The reasons why the tensile strength and elongation of the metal foil material are defined at room temperature are that it is usually convenient for defining such kinds of physical properties to use measured values at room temperature and that when they are defined at room temperature, values at a temperature other than room temperature can be deduced therefrom as values in proportion to those at room temperature.

Since the tensile strength and elongation of the metal foil material at room temperature are in connection with its thickness, appropriate values can be specified from the ranges described above.

The metal foil material which can be used in the present invention is not specifically restricted as long as it is a metal having a melting point of 300° C. or more in order to withstand the resin temperature and mold temperature at molding. Examples of the metal foil material include aluminum, stainless steel, copper, nickel, etc. The thickness of the metal foil material is set in the range of from 1 to 300 $\mu$m, and preferably from 5 to 200 $\mu$m. If the thickness is less than 1 $\mu$m, it is difficult to handle such a metal foil material, and on the other hand, if it exceeds 300 $\mu$m, the thickness of the resin inclusive of the semiconductor element is decreased, resulting in poor flowability of the resin during molding. Moreover, it is preferable for the metal foil material that an adhesive layer for the temporary fixation on the surface of mold cavity is previously provided on one face of the metal foil material.

The term "temporary fixation" means a degree of fixation such that the metal foil material does not separate by the opening and closing movement of molds, but can easily be peeled off from the mold after molding the resin as described above.

The adhesive used in this adhesive layer should be an adhesive which can temporarily fix the metal foil material to a mold heated at high temperature and which does not cause the deviation of the metal foil material during injecting the encapsulating resin. After molding, the adhesive is required that the semiconductor device can be taken out from the mold through the adhesion failure between the mold and the adhesive layer without cohesive failure in the adhesive layer or adhesion failure between the metal foil and the adhesive layer. Because the mold is in a high temperature state, examples of adhesives which satisfy these requirements and which can be used are heat-sensitive adhesives such as phenoxy resins, ethylene-vinyl acetate copolymers, and polyester resins or thermosetting resins such as epoxy resins. The thickness of the adhesive layer is preferably in the range of from 5 to 20 $\mu$m.

A method of incorporating an inorganic filler into the adhesive layer is effective for controlling the adhesion force to the mold cavity face. That is, due to the reinforcement by the inorganic filler, the cohesive force of the adhesive layer is enhanced to prevent the adhesive from remaining on the mold cavity face.

Examples of the inorganic fillers which can be used include silica, aluminum oxide, zirconium oxide, silver powder, aluminum powder, etc.

Considering a range for exhibiting the required functions in the average particle size of the filler used in this case, it has been found that the average particle size has a correlation to the thickness of the adhesive layer, and it has been proven that the average particle size of the inorganic filler is preferably 0.05 to 0.8 times the thickness of the adhesive layer. If it is less than 0.05, the adhesive layer tends to easily remain on the mold cavity face when releasing the semiconductor device from the mold. On the other hand, if it exceeds 0.8, the temporary fixation on the mold becomes poor.

Since the thickness of the adhesive layer which is preferably used is in the range of from 5 to 20 $\mu$m, the average particle size of the inorganic filler which is preferably used is generally from 1 to 10 $\mu$m. When the amount of the filler added is 3 to 40 parts by weight per 100 parts by weight of the adhesive, the cohesive force and the adhesion to the mold cavity face are suitably balanced. If it is less than 3 parts by weight, the adhesive layer tends to easily remain on the mold cavity face when releasing the semiconductor device from the mold. On the other hand, if it exceeds 40 parts by weight, the temporary fixation on the mold becomes poor. As a result of confirmation of an effect on the maximum particle size of the inorganic filler used in this case, it has been understood that since an inorganic filler has an inherent particle distribution, situations occur which cannot be explained only by the maximum particle size. It has been found that in the present invention the use of the inorganic filler having a maximum particle size of 1.5 to 3 times the thickness of the adhesive layer is effective for maintaining an adhesion force to the mold cavity face at a level which can withstand the shearing force during molding. The term "maximum particle size" used herein means a particle size where the cumulative weight percentage is 90%. It can be deduced that when an appropriate amount of inorganic particles having a particle size somewhat larger than the thickness of the adhesive layer are projected from the faces of the adhesive layer, an adhesion force to the mold cavity face decreases, whereby the metal foil material can easily be transferred toward the semiconductor device.

Silica can be advantageously used as the inorganic filler in the present invention. That is, since there are amorphous silica and crystalline silica in silica, a large amount of silica having a different particle size distribution exists in silica, and the amount of impurity ions is small. Therefore, silica can suitably be used in a semiconductor device.

As an organic material which constitutes the adhesive layer containing an inorganic filler as described above, thermosetting resins are preferable, because thermosetting resins excel in heat resistance and adhesion and, thus, an excessive decrease in the adhesion force can be suppressed even when the inorganic filler is used, and an adhesive force for the purpose of the temporary fixation can be controlled.

Typical thermosetting resins include epoxy resins, polyester resins, diallyl phthalate resins, polyimide resins, etc., with the use of an epoxy resin being preferred.

When an epoxy resin is used, it is preferable to formulate a rubber adhesive in an amount of 5 to 40% by weight based on the weight of the adhesive so as to impart flexibility to the adhesive layer. The thickness of the adhesive layer is preferably in the range of from 5 to 20 $\mu$m. A mold releasing agent having a mold releasing property to the mold, such as a silicone oil, a wax, or a filler may be incorporated in an amount of 0.01 to 5% by weight based on the weight of the adhesive.

It is necessary for transferring the metal foil material temporarily fixed on the mold cavity face to the surface of the semiconductor device with good productivity so as to obtain a metal foil-covered semiconductor device to achieve good mold releasing property between the temporarily fixing adhesive layer and the mold cavity face, and to overcome the problem of mold stain due to the adhesive remaining on the mold cavity face.

In order to deal with such problems, therefore, the present invention is also aimed at providing a metal foil material which improves the mold releasing property between the temporarily fixing adhesive layer and the mold cavity face, and which reduces an amount of the adhesive remaining on the molded face of the mold, and also providing a semiconductor device covered with the metal foil material with high productivity.

To be described in detail, the metal foil material of the present invention uses an adhesive wherein the tensile adhesive strength of the adhesive layer to a mold cavity face at 175° C. ranges from 0.3 to 5.0 kg/cm$^2$, and preferably from 0.5 to 4.0 kg/cm$^2$.

If it is less than 0.3 kg/cm$^2$, the metal foil material temporarily fixed onto the mold cavity face tends to move, deform or peel when injecting the encapsulating resin, and on the other hand, if it exceeds 5.0 kg/cm$^2$, the semiconductor device may be damaged when it is released from the mold. The term "tensile adhesive strength" used in the present invention means a value obtained by determining at 175° C. and at a tensile speed of 300 mm/min., a strength of a sample adhered by applying a pressure of 100 kgf/cm$^2$ at 175° C. according to JIS K 6849.

It is possible to obtain an adhesion force in this range by appropriately selecting a surface roughness of the mold cavity or of the metal foil material.

The metal foil-covered semiconductor device is described below.

The present invention also concerns a semiconductor device on which any of the metal foil materials described above is adhered. By covering the semiconductor device with the metal foil material, reliability of the semiconductor device including moisture resistance, resistance to thermal stress, crack resistance when soldering, etc., is improved. When the metal foil material described above is used to cover the semiconductor device, it is preferable to cover 20% or more, and preferably 80% or more, of the surface area of the semiconductor device. By covering 20% or more of the surface area, the resulting semiconductor device has enhanced reliability and enhanced crack resistance when soldering, in the TCT. This effect is remarkable when 80% or more of the surface area is covered.

Figure 3:
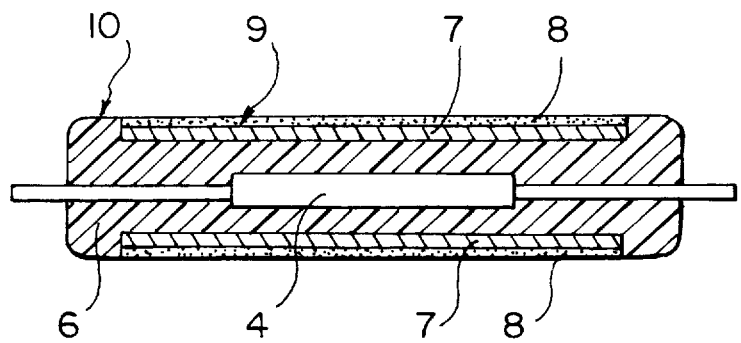
FIGS. 3 and 4 are is a schematic cross-sectional views of a metal foil-covered semiconductor device.
Figure 4:
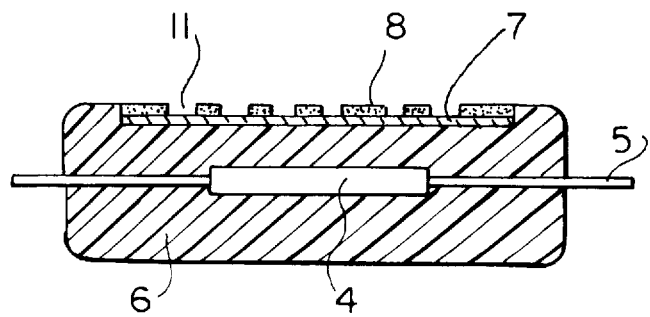

FIG. 3 shows a schematic cross-sectional view of a metal foil-covered semiconductor device using an adhesive layer for temporary fixation. The characteristic of the device is that the surface 9 of metal foil material 7 is depressed from the surface of the surrounding encapsulating resin 10. Further characteristic of the device is that the surface of the encapsulating resin and that of the adhesive layer have the same level, and as a result, the metal foil material is embedded in the encapsulating resin in a depth corresponding to the thickness of the adhesive layer. This has the advantages that the size of the semiconductor device and the size of the mold coincide or it is difficult to peel the metal foil material off the semiconductor device, as compared with the embodiment that the metal foil material is adhered on the semiconductor device. The adhesive layer on the metal foil in the state that it is adhered on the surface of the semiconductor device via the temporary fixation has a hardness without any practical problem.

It should, of course, be understood that FIG. 3 shows one embodiment of the semiconductor device of the present invention, and the semiconductor device of the present invention is not restricted thereto. For example, although the metal foil materials are adhered on both faces of the semiconductor device in the semiconductor device shown in FIG. 3, the semiconductor device of the present invention includes the device wherein the metal foil material is only adhered on one surface of the device.

Furthermore, the resin for encapsulating a semiconductor element which is used is a thermosetting resin such as an epoxy resin, a phenol resin, an urea resin, a melamine resin, a polyester resin, a diallylphthalate resin, a cross-linked polyphenylene sulfide resin, etc. Of these, an epoxy resin is preferred. Examples of the epoxy resin include bisphenol A type epoxy resins, phenol novolak type epoxy resins, cresol novolak type epoxy resins, alicyclic epoxy resins, naphthol type epoxy resins, biphenol type epoxy resins, dicyclopentadiene type epoxy resins, etc.

In this case, conventionally known additives such as a hardener, a hardening accelerator, a filler, and a mold releasing agent are formulated in an epoxy resin to prepare an epoxy resin composition.

Moreover, a semiconductor device in which individual identification information for the semiconductor device is recorded on the adhesive layer formed on the metal foil material is also one embodiment of the present invention.

The individual identification information including a product name of the semiconductor device, production lot, etc. is generally recorded on the surface of the semiconductor device after molding, but in the present invention it is preferable to record the information on the surface of the adhesive layer having a hardness on the metal foil material which covers the surface of the semiconductor device. The individual identification information may be recorded in a conventional method such as laser marking or stamping. In order to obtain a higher contrast, a pigment or a dyestuff such as carbon is added to the adhesive layer to color the adhesive layer, thereby removing an influence of excessive reflected light, making it possible to accurately identify the individual identification information in a wide angle.

The semiconductor device according to the present invention is obtained by temporarily fixing a metal foil material to a mold cavity face, setting a semiconductor element provided on a leadframe to the mold, closing the mold, injecting an encapsulating resin, and molding and hardening the resin.

Since the contact angle of the metal foil material used in this case to water is 110° or less, wettability between the metal foil material and the encapsulating resin is good, and the peeling of the metal foil material when molding the encapsulating resin, curing the encapsulating resin after molding, and applying thermal stress such as mounting the semiconductor device can be prevented.

Since the covering metal foil material selected has a tensile strength at room temperature in the range of from 5 to 20 kg/mm$^2$ and an elongation at room temperature of 20% or more, even when the semiconductor device is deformed by applying thermal stress, the metal foil material can flexibly correspond to effectively prevent the generation of crack.

By using a metal foil material having the above functions with an adhesive layer provided on the metal foil at the side in contact with the cavity, the metal foil-covered semiconductor device can be stably produced.

By incorporating an appropriate amount of inorganic fillers into the adhesive layer, the mold releasing of the semiconductor device from the mold cavity after molding can be controlled.

If the constituent resin used in the adhesive layer is thermosetting, since a decrease in adhesion due to the use of an inorganic filler can be covered, the control of mold releasing becomes easy.

If the optimum range of the tensile adhesion strength between the mold cavity and the adhesive layer on the metal foil material at 175° C., found through the above courses is selected, the metal foil-covered semiconductor device can be produced with good productivity. The surface roughness of the mold is selected from the range of 4 to 15 μm when the metal foil material is temporarily fixed to the mold cavity. As a result, in combination with the adhesive layer in which various resources have been made for the temporary fixation, the metal foil-covered semiconductor device can be produced with good productivity and, at the same time, a semiconductor device having a good appearance can be obtained.

The adhesive layer exists on the metal foil material of the resulting metal foil-covered semiconductor device, making it possible to produce a semiconductor device capable of recording individual identification information of the semiconductor device on the adhesive layer and being difficult to be ruptured when applying thermal stress.

As described above, according to the present invention, in adhering the metal foil material to the surface of semiconductor device, when a specific metal foil material which can protect the rupture when applying thermal stress is used, and an adhesive layer provided on the metal foil material having a mold cavity surface roughness suitable for producing a semiconductor device by temporarily fixing it on the surface of the mold cavity followed by molding is selected, a semiconductor device which is difficult to be damaged when applying thermal stress can be produced with good productivity. In addition, since an adhesive layer exists on the metal foil material, it is possible to record individual identification information concerning the semiconductor device on the adhesive layer.

Further, the metal foil-covered semiconductor device obtained in the present invention has the effects that since the metal foil material is depressed from the surface of the surrounding encapsulating resin unlike the embodiment that the metal foil material is adhered on an assembled semiconductor device, the outer size of the metal foil-covered semiconductor device is identical with that of the metal foil-uncovered semiconductor device, and therefore the metal foil-covered semiconductor device can be handled when mounting without any problem.

The present invention is described in more detail by reference to the following examples and comparative examples, but it should be understood that the invention is not construed as being limited thereto. Unless otherwise indicated, all parts, percents, ratios and the like are by weight.

A metal foil-covered semiconductor device was produced as follows.

(1) Temporary fixation of metal foil to surface of mold cavity

A metal foil used had a size of 16×12 mm and a thickness of 40 μm. An adhesive layer used for temporary fixation, formed on the metal foil at a thickness of 10 μm was an epoxy type adhesive having the following compositions.

| Epoxy resin (Bisphenol A type) | 5 parts |
| Rubber (Carboxylated nitrile rubber) | 2 parts |
| Hardener (Phenolic resin) | 3 parts |
| Hardening catalyst (Phosphorus type) | 0.3 part |

(2) Setting semiconductor element and frame to mold 80 pin QFP (size: 20×14×2 mm) and a member in which a semiconductor element (size: 6×6 mm) was adhered on a die pad (size: 8×8 mm) were set to the mold.

(3) Molds were closed, and an encapsulating resin was injected into the mold and molded at 175° C. for 2 minutes to obtain a metal foil-covered semiconductor device. The metal foil material 7 in the metal foil-covered semiconductor device obtained was depressed from the surface of the surrounding encapsulating resin as shown in FIG. 3.

EXAMPLE 1

The metal foil used was an aluminum foil having a contact angle of the face thereof which was in contact with the encapsulating resin, to water of 60°, a tensile strength at room temperature of 8 kgf/mm$^2$ and an elongation at room temperature of 35%.

EXAMPLE 2

The metal foil used was an aluminum foil, having a contact angle of the face thereof which was in contact with the encapsulating resin, to water of 990°, a tensile strength at room temperature of 18 kgf/mm$^2$. and an elongation at room temperature of 22%.

COMPARATIVE EXAMPLE 1

The metal foil used was an aluminum foil having a contact angle of the face thereof which was in contact with the encapsulating resin, to water of 120°, a tensile strength at room temperature of 8 kgf/mm$^2$ and an elongation at room temperature of 30%.

COMPARATIVE EXAMPLE 2

The metal foil used was an aluminum foil having a contact angle of the face thereof which was in contact with the encapsulating resin, to water of 60°, a tensile strength at room temperature of 40 kgf/mm$^2$ and an elongation at room temperature of 15%.

To examine the performances of the metal foil-covered semiconductor devices obtained in Examples 1 and 2 and Comparative Examples 1 and 2 above, those metal foil-covered semiconductor devices were subjected to a TCT of from −50° C./5 min to 150° C./5 min and a soldering resistance test in which the semiconductor device is placed in a thermostat at 85° C. and 85%RH for moisture absorption and then dipped in a soldering bath at 260° C. for 10 seconds, and the number of cracks generated in each test was measured. Further, in each case of after molding the encapsulating resin, after curing the molded resin and after TCT, whether the aluminum foil was peeled from the encapsulating resin surface (the semiconductor device surface) was observed using an ultrasonic probe.

The results obtained are shown in Table 1 below.

TABLE 1

|  | Example | | Comparative Example | |
| --- | --- | --- | --- | --- |
|  | 1 | 2 | 1 | 2 |
| Peeling of aluminum foil from encapsulating resin surface (number/20) | | | | |
| Just after molding | 0 | 0 | 10 | 0 |
| After curing | 1 | 0 | 12 | 0 |
| After TCT Cycle number: | | | | |
| 2,000 | 1 | 0 | 12 | 1 |
| 4,000 | 1 | 0 | 12 | 1 |
| 8,000 | 1 | 0 | 12 | 1 |
| Cracks generated after TCT (number/10) Cycle number: | | | | |
| 2,000 | 0 | 0 | 0 | 5 |
| 4,000 | 1 | 1 | 1 | 7 |
| 8,000 | 1 | 1 | 2 | 7 |
| Cracks generated after dipping in soldering bath at 260° C. for 10 seconds (number/10) Moisture-absorption time (hr) | | | | |
| 96 | 0 | 0 | 0 | 4 |
| 144 | 0 | 0 | 4 | 7 |
| 192 | 2 | 1 | 5 | 8 |

Note: In the TCT and soldering resistance test, metal foil-covered semiconductor devices which did not have an initial metal foil peeling after molding were used.

As is apparent from the data shown in Table 1 above, the aluminum foil in Examples 1 and 2 was tightly adhered to the surface of the semiconductor device, and as a result, peeling of aluminum foil is not observed even if applying thermal stress. Further, generation of cracks is not substantially observed even after TCT or soldering resistance test, due to the effect of the aluminum foil.

On the other hand, in Comparative Example 1 the peeling of the aluminum foil immediately after molding is remarkable, and in Comparative Example 2 the peeling of the aluminum foil immediately after molding is less, but the peeling thereof after applying thermal stress is remarkable, and cracks generate largely.

EXAMPLE 3

The same aluminum foil as used in Example 1 was used, and fused silica particles having an average particle size of 0.8 μm and the maximum particle size of 20 μm were contained in the adhesive layer in an amount of 20 parts per 100 parts of the adhesive. Thus, the average particle size was 0.08 time the thickness of the adhesive layer and the maximum particle size was 2.0 times the thickness of the adhesive layer.

EXAMPLE 4

The same aluminum foil as used in Example 1 was used, and crystalline silica particles having an average particle size of 3.0 μm and the maximum particle size of 25 μm were contained in the adhesive layer in an amount of 20 parts per 100 parts of the adhesive. Thus, the average particle size was 0.30 time the thickness of the adhesive layer and the maximum particle size was 2.5 times the thickness of the adhesive layer.

COMPARATIVE EXAMPLE 3

The same aluminum foil as used in Example 1 was used, and fused silica particles having an average particle size of 0.2 μm and the maximum particle size of 10 μm were contained in the adhesive layer in an amount of 20 parts per 100 parts of the adhesive. Thus, the average particle size was 0.02 time the thickness of the adhesive layer and the maximum particle size was 1.0 time the thickness of the adhesive layer.

COMPARATIVE EXAMPLE 4

The same aluminum foil as used in Example 1 was used, and fused silica particles having an average particle size of 10 μm and the maximum particle size of 40 μm were contained in the adhesive layer in an amount of 20 parts per 100 parts of the adhesive. Thus, the average particle size was 1.0 time the thickness of the adhesive layer and the maximum particle size was 4.0 times the thickness of the adhesive layer.

EXAMPLE 5

The same aluminum foil as used in Example 1 was used, and fused silica particles having an average particle size of 7 μm and the maximum particle size of 28 μm were contained in the adhesive layer in an amount of 20 parts per 100 parts of the adhesive. Thus, the average particle size was 0.7 time the thickness of the adhesive and the maximum particle size was 2.8 times the thickness of the adhesive layer. The adhesive layer thus formed had a tensile adhesive strength of 4.5 kgf/cm². Further, the cavity portion of the mold had a surface roughness of 5 μm.

EXAMPLE 6

Example 5 was followed except that the amount of the fused silica particles used was changed to 30 parts. The adhesive layer formed had a tensile adhesive strength at 175° C. of 2.0 kgf/cm².

COMPARATIVE EXAMPLE 5

Example 5 was followed except that the fused silica particles were not contained in the adhesive layer, the mold in which the cavity portion had a surface roughness of 20 μm was used, and the compositions of the adhesive layer were appropriately changed such that the adhesive layer had a tensile adhesive strength at 175° C. of 0.1 kgf/cm².

COMPARATIVE EXAMPLE 6

Example 5 was followed except that the fused silica particles were not contained in the adhesive layer, the mold in which the cavity portion had a surface roughness of 2 μm was used, and the compositions of the adhesive layer were appropriately changed such that the adhesive layer had a tensile adhesive strength at 175° C. of 7.5 kgf/cm².

Each of the metal foil-covered semiconductor devices obtained in Examples 3 to 6 and Comparative Examples 3 to 6 above was subjected to the TCT and the soldering resistance test in the same manners as described above, and the number of cracks generated was measured. Further, mold staining due to the adhesive layer, breakage of the semiconductor device when releasing from the mold, and movement or deformation of the aluminum foil due to poor adhesion of the adhesive layer to the mold were observed.

The results obtained are shown in Table 2 below.

TABLE 2

|  | Example | | | | Comparative Example | | | |
|---|---|---|---|---|---|---|---|---|
|  | 3 | 4 | 5 | 6 | 3 | 4 | 5 | 6 |
| Mold staining (number/24) | 0 | 0 | 0 | 0 | 22 | 0 | 0 | 12 |
| Breakage of semiconductor device (number/24) | 0 | 0 | 0 | 0 | 15 | 0 | 0 | 12 |
| Movement or deformation of aluminum foil (number/24) | 0 | 0 | 0 | 0 | 0 | 18 | 20 | 0 |
| Cracks after TCT (number/10) Cycle number: | | | | | | | | |
| 2,000 | 0 | 0 | 0 | 0 | 0 | 0 | 0 | 0 |
| 4,000 | 1 | 0 | 0 | 1 | 1 | 0 | 0 | 1 |
| 8,000 | 1 | 0 | 0 | 1 | 2 | 1 | 0 | 1 |
| Cracks after dipping in soldering bath (number/10) Moisture-absorption time (hr) | | | | | | | | |
| 96 | 0 | 0 | 0 | 0 | 0 | 0 | 0 | 0 |
| 144 | 0 | 0 | 0 | 0 | 1 | 0 | 0 | 0 |
| 192 | 2 | 0 | 0 | 1 | 1 | 0 | 2 | 2 |

The following will be apparent from the results shown in Table 2 above.

In Examples 3 and 4, the release property from the mold is good, and mold staining due to the adhesive layer and poor molding due to poor adhesion to the mold do not occur. Further, cracks in the metal foil-covered semiconductor device after applying thermal stress are not appeared in Example 4.

On the other hand, in Comparative Example 3 mold staining is remarkable, and also in Comparative Example 4 poor molding occurs largely due to poor adhesion.

In Examples 5 and 6, the mold release property is good, mold staining due to the adhesive layer and poor molding due to poor adhesion to the mold do not occur, and in Example 5 cracks after applying thermal stress are not observed.

On the other hand, in Comparative Example 5 since the metal foil material has a low adhesive force for temporary fixation, position deviation of the metal foil occurs during molding, and as a result, a good semiconductor device cannot be obtained. Further, in Comparative Example 6, the adhesive force to the cavity portion of the mold is too strong, so that mold staining occurs and the mold release property is poor. As a result, cracks occur in the semiconductor device after applying thermal stress.

While the invention has been described in detail and with reference to specific embodiments thereof, it will be apparent to one skilled in the art that various changes and modifications can be made therein without departing from the spirit and scope thereof.

What is claimed is:

1. A metal foil cover for a semiconductor device, consisting essentially of:
   (a) a metal foil having two faces, and
   (b) an adhesive layer on one face of said metal foil which is temporarily fixable on a surface of a cavity of a mold
   wherein the contact angle of the face of the metal foil upon -contact with an encapsulating resin during molding, to water is 110° or less.

2. A metal foil cover as claimed in claim 1, wherein the metal foil material has a tensile strength at room temperature of from 5 to 20 kgf/mm$^2$, and an elongation at room temperature of 20% or more.

3. A metal foil cover as claimed in claim 1, wherein the adhesive layer contains an inorganic filler in an amount of 3 to 40 parts by weight per 100 parts by weight of the adhesive.

4. A metal foil cover as claimed in claim 3, wherein the inorganic filler has an average particle size of from 0.05 to 0.8 times the thickness of the adhesive layer.

5. A metal foil cover as claimed in claim 4, wherein the inorganic filler has the maximum particle size of from 1.5 to 3 times the thickness of the adhesive layer.

6. A metal foil cover as claimed in claim 3, wherein the inorganic filler is silica.

7. A metal foil cover as claimed in claim 1, wherein the adhesive layer comprises a thermosetting resin and an inorganic filler.

8. A metal foil cover as claimed in any of claims 1–2, wherein the adhesive layer has a tensile adhesion strength to the mold cavity face at 175° C. of from 0.3 to 5.0 kgf/cm$^2$.

9. An encapsulated semiconductor device comprising:
   (i) a semiconductor device having a surface;
   (ii) the metal foil cover of claim 1 comprising the metal foil material (a) and the adhesive layer (b), wherein the adhesive layer has a thickness of 5 to 20 μm and wherein the adhesive layer contains an inorganic filler in an amount of 3 to 40 parts by weight per 100 parts by weight of the adhesive: and,
   (iii) an encapsulating resin,
   wherein the metal foil material is adhered on the semiconductor device surface such that the metal foil material is embedded in the encapsulating resin in a depth corresponding to the thickness of the adhesive layer from a face formed from the encapsulating resin and the adhesive layer.

10. A semiconductor device as claimed in claim 9, wherein individual identification information is recorded on the adhesive layer of the metal foil material.

11. A metal foil according to claim 1, wherein the adhesive layer has a thickness of 5 to 20 μm.

12. A metal foil cover as claimed in claim 1, wherein the adhesive layer is a flexible adhesive layer.

13. A metal foil cover according to claim 1, wherein the face of the metal foil upon contact with an encapsulating resin during molding, to water, has a contact angle measurement of 25° to 100°.

* * * * *